United States Patent
Young et al.

(10) Patent No.: US 9,985,159 B2
(45) Date of Patent: May 29, 2018

(54) PASSIVATED CONTACT FORMATION USING ION IMPLANTATION

(71) Applicant: Alliance for Sustainable Energy, LLC, Golden, CO (US)

(72) Inventors: David L. Young, Golden, CO (US); Pauls Stradins, Golden, CO (US); William Nemeth, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days. days.

(21) Appl. No.: 15/349,630

(22) Filed: Nov. 11, 2016

(65) Prior Publication Data

US 2017/0141254 A1    May 18, 2017

Related U.S. Application Data

(60) Provisional application No. 62/254,861, filed on Nov. 13, 2015.

(51) Int. Cl.
| | |
|---|---|
| *H01L 31/02* | (2006.01) |
| *H01L 31/0368* | (2006.01) |
| *H01L 31/0376* | (2006.01) |
| *H01L 31/18* | (2006.01) |
| *H01L 31/0216* | (2014.01) |
| *H01L 31/061* | (2012.01) |
| *H01L 31/0224* | (2006.01) |

(Continued)

(52) U.S. Cl.
CPC .......... *H01L 31/061* (2013.01); *H01L 31/028* (2013.01); *H01L 31/0288* (2013.01); *H01L 31/02168* (2013.01); *H01L 31/02363* (2013.01); *H01L 31/022425* (2013.01); *H01L 31/0682* (2013.01); *H01L 31/0687* (2013.01); *H01L 31/1804* (2013.01); *H01L 31/1864* (2013.01)

(58) Field of Classification Search
CPC .... Y02E 10/547; Y02P 70/521; H01L 21/266; H01L 31/0747; H01L 31/03529; H01L 31/022441; H01L 31/1864; H01L 31/1804
See application file for complete search history.

(56) References Cited

U.S. PATENT DOCUMENTS

| | | | |
|---|---|---|---|
| 5,532,175 A | 7/1996 | Racanelli et al. | |
| 6,331,456 B1 * | 12/2001 | Wu | H01L 21/76245 257/E21.565 |

(Continued)

OTHER PUBLICATIONS

Feldmann et al., "A Passivated Rear Contact for High-Efficiency n-Type Silicon Solar Cells Enabling High $V_{oc}$S and FF>82%," presented at the 28th European PV Solar Energy Conference and Exhibition, Sep. 30, 2013 through Oct. 4, 2013, Paris, France, pp. 1-5.

(Continued)

*Primary Examiner* — Kimberly Rizkallah
*Assistant Examiner* — Brian Turner
(74) *Attorney, Agent, or Firm* — Michael A. McIntyre; Robert G. Pittelkow

(57) ABSTRACT

Methods for forming passivated contacts include implanting compound-forming ions into a substrate to about a first depth below a surface of the substrate, and implanting dopant ions into the substrate to about a second depth below the surface. The second depth may be shallower than the first depth. The methods also include annealing the substrate.

20 Claims, 3 Drawing Sheets

(51) Int. Cl.
*H01L 31/0687* (2012.01)
*H01L 31/0288* (2006.01)
*H01L 31/028* (2006.01)
*H01L 31/0236* (2006.01)
*H01L 31/068* (2012.01)

(56) References Cited

U.S. PATENT DOCUMENTS

| | | | |
|---|---|---|---|
| 2002/0072116 A1* | 6/2002 | Bhatia | C12M 25/14 435/366 |
| 2002/0089032 A1* | 7/2002 | Huang | H01L 21/76243 257/507 |
| 2007/0256728 A1* | 11/2007 | Cousins | H01L 31/0745 136/252 |
| 2009/0068783 A1 | 3/2009 | Borden | |
| 2010/0203742 A1 | 8/2010 | Borden et al. | |
| 2010/0221867 A1* | 9/2010 | Bedell | H01L 21/7624 438/96 |
| 2010/0237440 A1* | 9/2010 | Ito | H01L 21/26506 257/408 |
| 2012/0129301 A1 | 5/2012 | Or-Bach et al. | |
| 2012/0247560 A1* | 10/2012 | Rim | H01L 21/02381 136/261 |
| 2014/0090701 A1 | 4/2014 | Rim et al. | |
| 2014/0110792 A1* | 4/2014 | Noorlag | H01L 27/092 257/369 |
| 2015/0144183 A1 | 5/2015 | Yang et al. | |
| 2015/0236176 A1 | 8/2015 | Lee et al. | |
| 2016/0087140 A1* | 3/2016 | Rim | C30B 29/06 136/256 |

OTHER PUBLICATIONS

Latchford et al., "Enabling the rapid shift in the solar technology roadmap using ENERGi™ ion implantation," poster paper presented at SNEC, Shanghai, China, May 20-22, 2014, five pages.

Stradins et al., "Passivated Tunneling Contacts to N-Type Wafer Silicon and Their Implementation into High Performance Solar Cells," conference paper presented at WCPEC-6: 6th World Conference on Photovoltaic Energy Conversion, Kyoto, Japan, Nov. 23-27, 2014, NREL/CP-5J00-63259, six pages.

Zhu et al., "Cost-effective industrial n-type bifacial and IBC cells with ENERGi™ P and B ion implantation," oral paper presented at SNEC, Shanghai, China, May 20-22, 2014, seven pages.

* cited by examiner

PASSIVATED CONTACT FORMATION USING ION IMPLANTATION

CROSS-REFERENCE TO RELATED APPLICATIONS

This application claims the benefit of U.S. Provisional Patent Application No. 62/254,861, filed Nov. 13, 2015, the entire content of which is incorporated herein by reference.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Photovoltaic (PV) devices such as solar cells continue to increase in use. As many advancements and improvements have been made, PV device research continues to push energy conversion efficiency higher and push costs lower. One area of improvement relates to the minimization of carrier recombination at cell contacts (e.g., the surface) of PV devices by forming "passivated contacts" that have low carrier recombination (energy loss), but allow carriers to be extracted for power.

Surface passivation is one method used to reduce carrier recombination. Surface passivation, in general, involves reducing carrier recombination sites at the surface by forming a surface with no chemical bonds left unbonded or by shielding one type of carrier from reaching the exposed surface with an electric field. Both of these results can be accomplished by applying another material on the surface of solar cells, and/or by diffusing dopants into the wafer.

SUMMARY

In one example, a method includes implanting compound-forming ions into a substrate to about a first depth below a surface of the substrate, and implanting dopant ions into the substrate to about a second depth below the surface. The second depth is shallower than the first depth. The method also includes annealing the substrate.

In another example, a method includes creating a first region within a substrate by using an ion implantation device. The first region includes compound-forming ions and extends from about a first depth below a surface of the substrate to about a second depth below the surface of the substrate, with the second depth being shallower than the first depth. The method also includes creating a second region within the substrate by using the ion implantation device. The second region may include dopant ions and may extend from about a third depth below the surface of the substrate to about a fourth depth below the surface of the substrate, with the fourth depth being shallower than the third depth and the third depth being shallower than the first depth. The method may also include annealing the substrate to transform the first region into a compound layer and to transform the second region into a doped layer.

The details of one or more examples are set forth in the accompanying drawings and the description below. Other features, objects, and advantages will be apparent from the description and drawings, and from the claims.

DETAILED DESCRIPTION

Figure 1A:
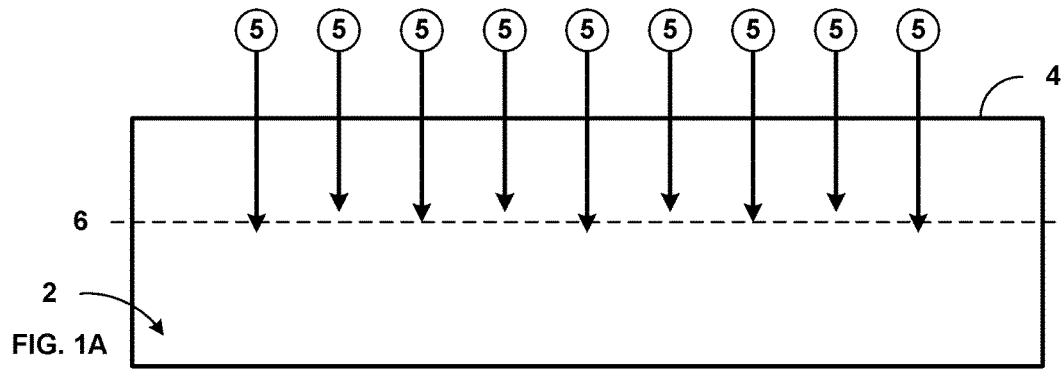
FIGS. 1A-1D are conceptual diagrams illustrating example stages of a substrate during formation of passivated contacts using ion implantation, in accordance with one or more aspects of the present disclosure.

Techniques of the present disclosure provide methods for forming low recombination contacts for semiconductor devices using ion implantation. For example, in accordance with the techniques described herein, passivated contacts may be formed on a solar cell by performing ion implantations and an anneal to create, within the cell, a compound layer providing surface passivation and carrier transport and a doped layer at least in part overlaying the compound layer. In some examples, metal may then be deposited on the surface of the cell to complete the contacts. In other examples, one or more additional layers may be deposited on the surface of the cell to create a multi junction PV device. The techniques of the present disclosure are generally described herein using wafer silicon solar cells as one example. However, some or all of the techniques described herein may also be applied to various other devices, such as light emitting diodes, transistors, and others, and to devices made of other materials, such as devices made of gallium arsenide (GaAs), cadmium telluride (CdTe), copper indium gallium selenide (CIGS), perovskite materials, and others.

By using ion implantation to form both the passivating compound layer and the doped layer, devices created using the techniques of the present disclosure may undergo reduced processing during fabrication. Because both layers may be formed via ion implantation, the methods described herein may use fewer and/or easier process operations. Furthermore, because both layers can be formed, for example, in the same ion implantation chamber, devices may not need to be removed, cleaned, and/or otherwise processed between implantations. As a result, the fabrication complexity and/or the time required to form devices having passivated contacts may be substantially reduced. Additionally, in some examples, the resulting doped layer may retain a crystalline structure, allowing for the deposition of additional layers thereon using epitaxial growth. In some examples, the resulting doped layer may have a monocrystalline structure and may be structurally identical to the structure of the underlying portion of the substrate.

While related art techniques have been shown to form compound layers such as oxide layers in a wafer, those compound layers are generally used to insulate and effectively isolate portions of a wafer from one another. In contrast, the techniques described herein may use ion implantation to form a compound layer that is thin enough and/or otherwise configured to provide carrier transport across the compound layer. That is, the ion implantation-formed compound layer may be grown to be capable of conducting charge, and may be used for this purpose in a device. Furthermore, such a compound layer, created using ion implantation, may also passivate the interface between the wafer and the compound layer. Consequently, some or all of a passivated contact may be formed using ion implantation.

FIGS. 1A-1D are conceptual diagrams illustrating example stages of a substrate during formation of passivated contacts using ion implantation, in accordance with one or more aspects of the present disclosure. The example of FIGS. 1A-1D describes only one example of forming passivated contacts via multiple ion implantations, and different operations and/or variations may be used in other examples, in accordance with the techniques described herein.

The example of FIGS. 1A-1D illustrate stages of substrate 2. FIGS. 1A-1D are side views of substrate 2. As shown in FIG. 1A, substrate 2 has surface 4. Substrate 2, as shown in the example of FIGS. 1A-1D, may represent a silicon wafer having a resistivity of about 1-10 ohm-cm that is usable to create a PV device. In other examples, substrate 2 may represent a region of a PV device (e.g., an emitter or contact region), a region of another semiconductor device (e.g., a transistor), or any other material or device on which the techniques described herein may be used to form passivated contacts. In other words, while referenced as a substrate herein, substrate 2 may, in various examples, be any device or device region suitable for forming passivated contacts using multiple ion implantations as described in the present disclosure.

Substrate 2 may represent a functional region or a device region of a wafer (e.g., as opposed to an inactive or inert region). In this sense, the techniques described herein may be different from related art techniques, such as silicon on insulator (SOI) techniques that essentially isolate a functional region (where devices may be formed) from an underlying, inactive or unused portion of a wafer. That is, the compound layer described herein may allow carrier transport through the compound layer, whereas layers formed in related art techniques, such as SOI oxide layers, are insulating layers that purposefully block carrier transport.

Substrate 2, in the example of FIGS. 1A-1D, may be composed substantially of a monocrystalline material, such as monocrystalline silicon (c-Si). In other examples, substrate 2 may be composed substantially of a polycrystalline material, an amorphous material, or any other material suitable for use with the techniques described herein.

In the example of FIGS. 1A-1D, compound-forming ions 5 are implanted into substrate 2 to about first depth 6 below surface 4, as shown in FIG. 1A. For instance, substrate 2 may be cleaned and placed in an ion implanter (not shown). The ion implanter may be configured to bombard surface 4 of substrate 2 with oxygen (O) ions using sufficient energy to cause the O ions to enter substrate 2 and come to rest about 60 nanometers (nm) below surface 4. As used herein when referring to a value or range, the term "about" may indicate different amounts of variability in different examples. For instance, about 60 nm may indicate between 58 and 62 nm, between 55 and 65 nm, between 50 and 70 nm, or another acceptable or intended amount of variability around 60 nm.

In various examples, first depth 6 may be anywhere between about 20 nm and about 300 nm below surface 4 of substrate 2. With depths as shallow as 20 nm (or even less), the techniques described herein may not, in some examples, need extra high ion energies for implantation. The energy and dose of the ion beam used to implant compound-forming ions 5 may depend on the material, the device configuration, the later processing conditions of substrate 2, and/or other factors.

The term "compound-forming ion," as used herein, refers to any ion (or ions) that, when implanted into a target substrate with sufficient quantities and subsequently annealed, is (are) able to combine with material of the substrate and/or with other implanted ions or atoms to create a compound layer that will provide both passivation and transport properties. Thus, in the example of FIGS. 1A-1D, where substrate 2 is silicon (Si), compound-forming ions 5 may include O ions, nitrogen (N) ions, and/or hafnium (Hf) ions, which may form $SiO_2$, $SiN_x$, and/or $HfO_x$ compounds with the Si upon annealing. As used herein, the term "compound-forming ion" does not include atoms or ions used as dopants for a substrate, or atoms or ions implanted into the substrate at a quantity insufficient to form a compound layer.

In some examples, compound-forming ions 5 may be implanted with additional atoms or ions. The additional atoms or ions may help to form the compound layer, but may not be incorporated into the compound layer themselves. For instance, compound-forming ions 5 may be implanted with hydrogen (H) atoms, helium (He) atoms, or other atoms or ions.

Figure 1B:
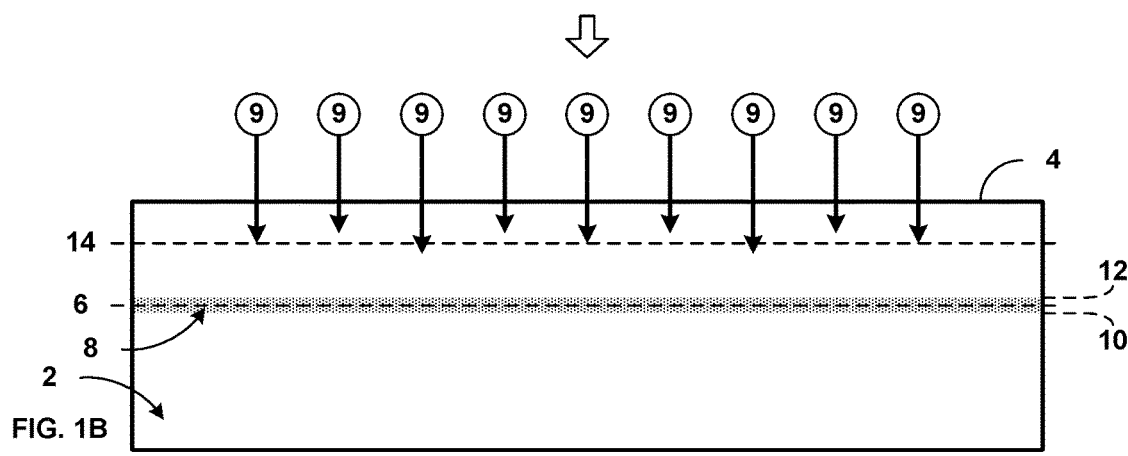

As a result of implanting compound-forming ions 5, substrate 2 includes first region 8, as shown in FIG. 1B. First region 8 extends about from depth 10 to depth 12. First region 8 includes compound-forming ions 5.

In the example of FIGS. 1A-1D, dopant ions 9 are implanted into substrate 2 to about second depth 14 below surface 4, as shown in FIG. 1B. Second depth 14 is shallower than first depth 6. For instance, phosphorus (P) ions or other dopants may be implanted into substrate 2 at a depth shallower than the depth at which compound-forming ions 5 were implanted. In various examples, second depth 14 may be anywhere between about 10 nm and about 300 nm below surface 4 of substrate 2. With depths as shallow as 10 nm (or even less), the techniques described herein may not, in some examples, need extra high ion energies for implantation.

In some examples, substrate 2 may not need to undergo substantial processing between implantation of compound-forming ions 5 and implantation of dopant ions 9. That is, substrate 2 may remain in the ion implanter or transferred to another ion implanter and may, in some examples, be implanted with dopant ions 9 following implantation of compound-forming ions 5.

The energy and dose of the ion beam used to implant dopant ions 9 may depend on the material, the device configuration, the later processing conditions of substrate 2, and/or other factors. In some examples, dopant ions 9 may be implanted with more energy variability than was used to implant compound-forming ions 5. Consequently, dopant ions 9 may be implanted over a wider depth range when compared to the depth range at which compound-forming ions 5 are implanted. In some examples, when compared with the amount of implanted compound-forming ions 5, a relatively larger amount of dopant ions 9 may be implanted into substrate 2.

The term "dopant ion," as used herein, refers to any ion (or ions) that is (are) usable to dope a target substrate to increase the carrier concentration of the substrate semiconducting material. That is, dopant ions may be used to add electrons or holes to the crystal structure of a material via substitutional element replacement. Thus, in the example of FIGS. 1A-1D, where substrate 2 is Si, dopant ions 5 may include P ions, arsenic (As) ions, boron (B) ions, aluminum (Al) ions, indium (In) ions, gallium (Ga) ions, and/or other dopant ions.

Figure 1C:
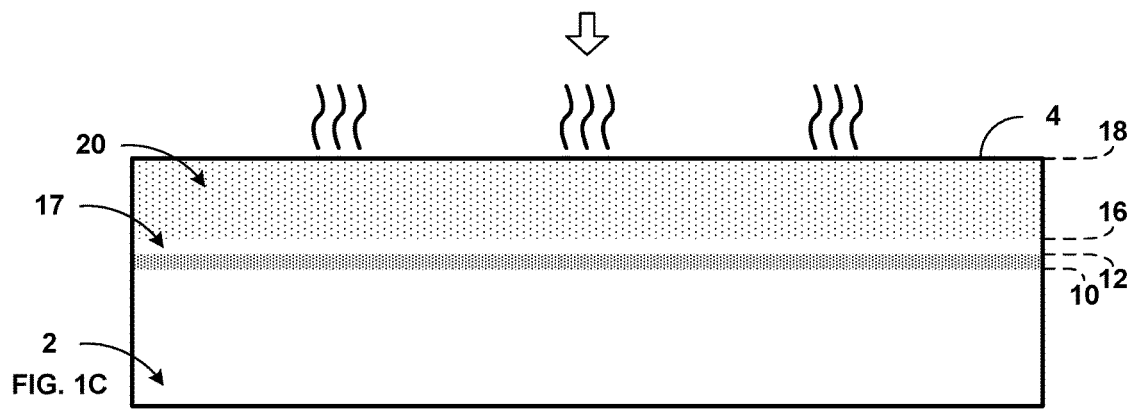

As shown in FIG. 1C, substrate 2 includes second region 20 as a result of implanting dopant ions 9. Second region 20 extends about from depth 16 to depth 18. Second region 20 includes dopant ions 9. Depth 16 is shown in the example of FIG. 1C as being closer to surface 4 than depth 12 and depth 10, leaving gap region 17 between first region 8 and second region 20. In some examples, depth 18 may additionally or alternatively be below surface 4, leaving a gap region (not shown) between second region 20 and surface 4. In some examples, there may be no gap region. In some examples, depth 16 may be further from surface 4 than depth 12 or further from surface 4 than depth 10. In other words, second region 20, in various examples, may not intersect first region 8, may extend partway into first region 8, or may extend completely through first region 8.

In the example of FIGS. 1A-1D, substrate 2 is annealed, as shown in FIG. 1C. For instance, substrate 2 may be annealed at about 800-1200° C. degrees for about 30-90 minutes. The temperature and duration of the anneal may vary depending on the material of substrate 2, the type of compound-forming ions 5, the type of dopant ions 9, and/or other factors.

In some examples, such as the example of FIGS. 1A-1D, substrate 2 is subjected to a single anneal after implantation of both compound-forming ions 5 and dopant ions 9. In other examples, substrate 2 may be subjected to an anneal after each implantation. That is, in some examples, substrate 2 may be subjected to a first anneal after implanting compound-forming ions 5 and a second anneal after implanting dopant ions 9. For instance, separate anneals may be used when using different annealing conditions (e.g., temperature, duration, atmosphere, or others) for compound-forming ions 5 and for dopant ions 9.

Figure 1D:
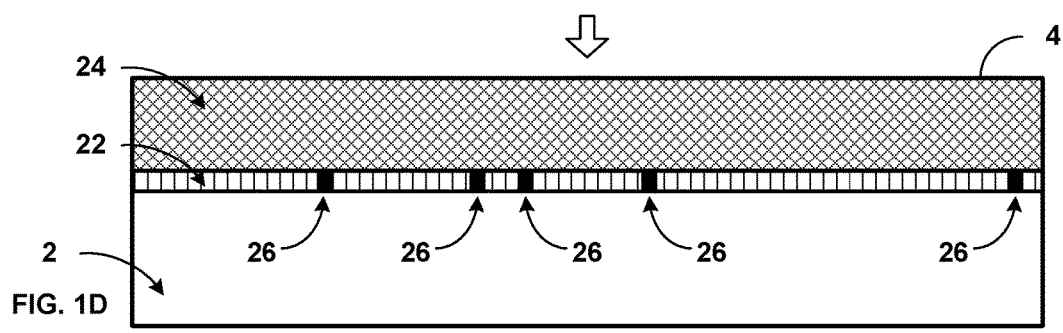

Annealing substrate 2 may transform first region 8 and at least second region 20 into compound layer 22 and doped layer 24, respectively, as shown in FIG. 1D. For instance, annealing substrate 2 may grow $SiO_2$ at about the depth of the O ion implant (e.g., depth 6) and activate dopant ions 9, helping dopant ions 9 to diffuse. In some examples, substrate 2 may be annealed in such a way as to cause dopant ions 9 to diffuse upward all the way to surface 4. In some examples, substrate 2 may be annealed in such a way as to not cause dopant ions 9 to diffuse all the way to surface 4. In some examples, substrate 2 may be annealed in such a way as to cause dopant ions 9 to diffuse downward to the top surface of first region 8. In some examples, substrate 2 may be annealed in such a way as to not cause dopant ions 9 to diffuse all the way to the top surface of first region 8. In some examples, substrate 2 may be annealed in such a way as to cause dopant ions 9 to diffuse downward past the top surface of first region 8. In some examples, substrate 2 may be annealed in such a way as to cause dopant ions 9 to diffuse partway into first region 8, or diffuse all the way through first region 8 into the underlying portion of substrate 2. In some examples, annealing substrate 2 may cause the dopant ions to become substitutional dopants, replacing atoms in the structure of substrate 2.

Additionally, annealing substrate 2 may heal damage to substrate 2 caused by implanting compound-forming ions 5 and/or dopant ions 9. For instance, ion implantation may amorphize or otherwise modify the structure of a region into which the ions are implanted. In some examples, annealing substrate 2 after ions are implanted may cause realignment of the structure in ion implanted regions. In other words, annealing substrate 2 after ion implantation may cause recrystallization of the crystal lattice in compound layer 22 and/or doped layer 24. In some examples, annealing substrate 2 may result in compound layer 22 and/or doped layer 24 having a monocrystalline structure that may be identical to the structure of substrate 2. This may allow the resulting device to serve as a substrate for additional epitaxial growth.

As shown in FIG. 1D, the configuration of substrate 2, after annealing, may include the underlying portion of substrate 2 (e.g., Si), compound layer 22 (e.g., $SiO_2$), and doped layer 24 (e.g., doped c-Si). Compound layer 22 may passivate substrate 2 and allow for carrier transport through compound layer 22, between doped layer 24 and the un-modified portion of substrate 2.

In some examples, metal may be deposited onto doped layer 24 to form low resistance contacts. For example, Al, nickel (Ni), silver (Ag) or another metal may be deposited onto surface 4 via electrodeposition, sputtering, evaporation, screen printing, ink jet, or another deposition technique. Such contact structures may provide a well passivated surface between layer 22 and the underlying portion of substrate 2 and may provide low contact resistivity for carriers passing from the underlying portion of substrate 2, through layer 22, through layer 24 to metal deposited on surface 4.

In some examples, one or more additional device layers may be deposited on surface 4 of substrate 2. For instance, depositing additional layers may be used to create multi junction PV devices, such as a tandem cell.

In some examples, doped layer 24 may allow for deposition of one or more layers on surface 4 via epitaxial growth. That is, in some examples, as a result of using the methods described herein, doped layer 24 may have a crystalline structure allowing for epitaxially growing additional layers thereon. For instance, when substrate 2 has a substantially monocrystalline structure, the techniques described herein may be performed in a manner that maintains that monocrystalline structure in doped layer 24. Providing for epitaxial growth may be advantageous for growing III-V materials on surface 4 to form high efficiency multi junction devices.

As one example method, a monocrystalline structure may be maintained in doped layer 24 by performing the implantation of dopant ions 9 such that a portion having a monocrystalline structure remains between first region 8 and surface 4. That is, the energy and/or dosage used to implant dopant ions 9 may be tailored to leave gap region 17 between first region 8 and second region 20 and/or leave another gap region between second region 20 and surface 4. Gap regions may have the original crystalline structure of substrate 2. When such a gap region is maintained, annealing substrate 2 may result in the implant-damaged (e.g., amorphized) structure of second region 20 realigning to a monocrystalline structure, based on the retained monocrystalline structure of the gap region.

In some examples, compound layer 22 can be grown thin (e.g., less than 100 Å) to allow quantum mechanical tunneling of carriers between the underlying portion of substrate 2 and doped layer 24, via compound layer 22. Other transport mechanisms such as defect assisted tunneling or thermionic transport are also possible through layer 22. In other examples, compound layer 22 can be grown relatively thicker (e.g., 75 Å, 100 Å, or other thickness). In some such examples, annealing substrate 2 at relatively high temperatures may "break up" or "ball up" material within compound layer 22, allowing small pinhole areas 26 through which dopants can diffuse from doped layer 24, through compound layer 22, to the un-modified portion of substrate 2. That is, compound layer 22 may have one or more areas substantially free of compound-forming atoms, and dopant ions from doped layer 24 may diffuse through these areas and into the underlying portion of substrate 2. Either configuration may be created to provide a low recombination, ohmic contact to the wafer.

In this way, the techniques described herein may provide an improved method for forming passivated contacts using multiple ion implantations. Fewer and/or easier process operations may be used and, in some examples, a crystalline structure, such as a monocrystalline structure, may be maintained for further epitaxial growth on the passivated contact surface.

Figure 2:
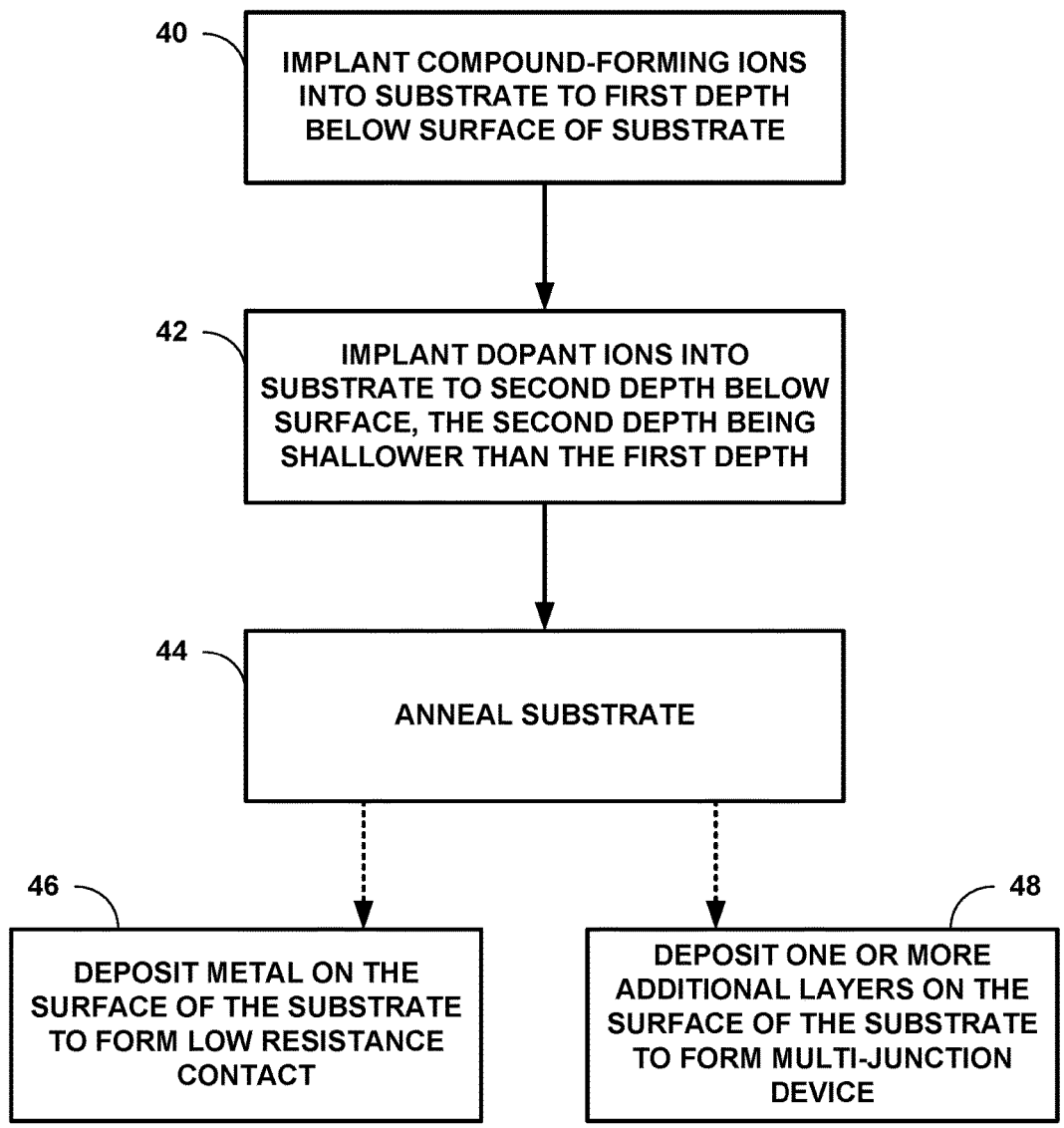
FIG. 2 is a flowchart illustrating example operations for forming passivated contacts using ion implantation, in accordance with one or more aspects of the present disclosure.

FIG. 2 is a flowchart illustrating example operations for forming passivated contacts using ion implantation, in accordance with one or more aspects of the present disclosure. The operations of FIG. 2 represent only one example method implementing the techniques described herein, and various additional or different operations may be used in other examples.

In the example of FIG. 2, an ion implantation device may be used to implant compound-forming ions into a substrate to about a first depth below a surface of the substrate (40). For instance, O ions may be implanted into a wafer of crystalline Si. In some examples, such as formation of a solar cell having front and back contacts, the compound-forming ions may be implanted through both a front surface and back surface of the substrate.

The ion implantation device may be used, in the example of FIG. 2, to implant dopant ions into the substrate to about a second depth below the surface (42). The second depth may be shallower than the first depth. For instance, P ions or other dopant ions may be implanted into the Si wafer at a depth shallower than the oxygen ions were implanted.

In some examples, operation 40 and/or operation 42 may be performed more than once. For instance, when forming both front and back contacts to a device, a first implantation of compound-forming ions (e.g., O ions) and of dopant ions (e.g., P ions) may be performed through the front surface of the substrate and a second implantation of compound-forming ions (e.g., O ions) and of dopant ions (e.g., B ions) may be performed through the bottom surface of the substrate. As another example, interdigitated contacts may be formed by performing a first implantation of dopant ions (e.g., P-type dopants such as B) into a substrate through a first portion of a surface of the substrate, and performing a second implantation of dopant ions (e.g., N-type dopants such as P) into the substrate through a second portion of the surface that is different from the first portion. In some examples, it may be advantageous to vary the conditions (e.g., ion type, quantity, implant energy, implant depth, etc.) of the compound-forming ion implantation. For instance, when performing separate implantations of two different types of dopant ions, the compound layer under one type of dopant ions may be thicker than the compound layer under the other type of dopant ions. In other words, while described in some examples as a single implantation of compound-forming ions and a single implantation of dopant ions, the techniques described herein may, in other examples, include more than one implantation of compound-forming ions, of dopant ions, or of both compound-forming ions and dopant ions.

In the example of FIG. 2, the substrate may be annealed (44). Annealing the substrate may heal any damage to the substrate caused by ion implantation and also create a compound layer at about the first depth and a doped layer at least between about the second depth and the surface of the substrate. The compound layer and doped layer may serve as part of a passivated contact, providing passivation to the un-modified portion of the substrate while allowing for carrier transport.

In some examples, as shown in FIG. 2, metal may be deposited on the surface of the substrate to form a low resistance contact (46). For instance, metal may be deposited via electrodeposition or other suitable techniques. The resulting electrical contact may have improved carrier recombination characteristics and passivation to the substrate compared with direct metallization of the substrate.

In other examples, as shown in FIG. 2, one or more additional layers may be deposited on the surface of the substrate (48). In some examples, the one or more additional layers may be formed via epitaxial growth. In some examples, the one or more additional layers form a portion of a multi junction solar cell. For instance, another device portion may be grown on top of the substrate to form a tandem solar cell. In some examples, the doped layer may have a crystalline structure that allows for epitaxial growth on the surface of the doped layer, which may be useful for forming III-V device structures.

In some examples, the compound layer may have a thickness of about 10 nanometers or less. In some examples, the compound layer includes a layer having one or more areas that are substantially free of compound-forming atoms, the one or more areas being permeable by dopants. In some examples, the doped layer has a monocrystalline structure.

In some examples, the compound-forming ions and the dopant ions are implanted into a functional region of the substrate. In some examples, annealing the substrate includes performing a first anneal of the substrate prior to implanting the dopant ions, and performing a second anneal of the substrate subsequent to implanting the dopant ions. In some such examples, the first anneal is performed using first annealing conditions and the second anneal is performed using second annealing conditions, the first annealing conditions being different from the first annealing conditions.

In some examples, the first depth is between about 20 nanometers below the surface of the substrate and about 300 nanometers below the surface of the substrate. In some examples, the second depth is between about 10 nanometers below the surface of the substrate and about 300 nanometers below the surface of the substrate.

In some examples, the compound-forming ions include at least one of oxygen ions, nitrogen ions, or hafnium ions. In some examples, implanting the compound-forming ions may include implanting additional atoms that facilitate formation of a compound layer during annealing. In some examples, the dopant ions include at least one of phosphorus ions, arsenic ions, antimony ions, boron ions, aluminum ions, indium ions, or gallium ions. In some examples, the substrate is silicon. More specifically, in some examples the substrate is monocrystalline silicon.

As another example incorporating the techniques described herein, a method includes creating a first region within a substrate by using an ion implantation device. The first region includes compound-forming ions, the first region extends from about a first depth below a surface of the substrate to about a second depth below the surface of the substrate, and the second depth is shallower than the first depth. The method also includes creating a second region within the substrate by using the ion implantation device. The second region includes dopant ions, the second region extends from about a third depth below the surface of the substrate to about a fourth depth below the surface of the substrate, and the fourth depth is shallower than the third depth. The method also includes annealing the substrate to transform the first region into a compound layer and to transform the second region into a doped layer.

In some such examples, the third depth is shallower than the second depth. In some such examples, creating the second region includes leaving a gap region between the third depth and the second depth, the gap region has a monocrystalline structure, and annealing the substrate transforms the gap region into a portion of the doped layer. In some such examples, creating the second region includes leaving a gap region between the fourth depth and the surface of the substrate, the gap region has a monocrystalline structure, and annealing the substrate transforms the gap region into a portion of the doped layer. In some such examples, the second region has a polycrystalline or amorphous structure and the doped layer has a monocrystalline structure.

Figure 3:
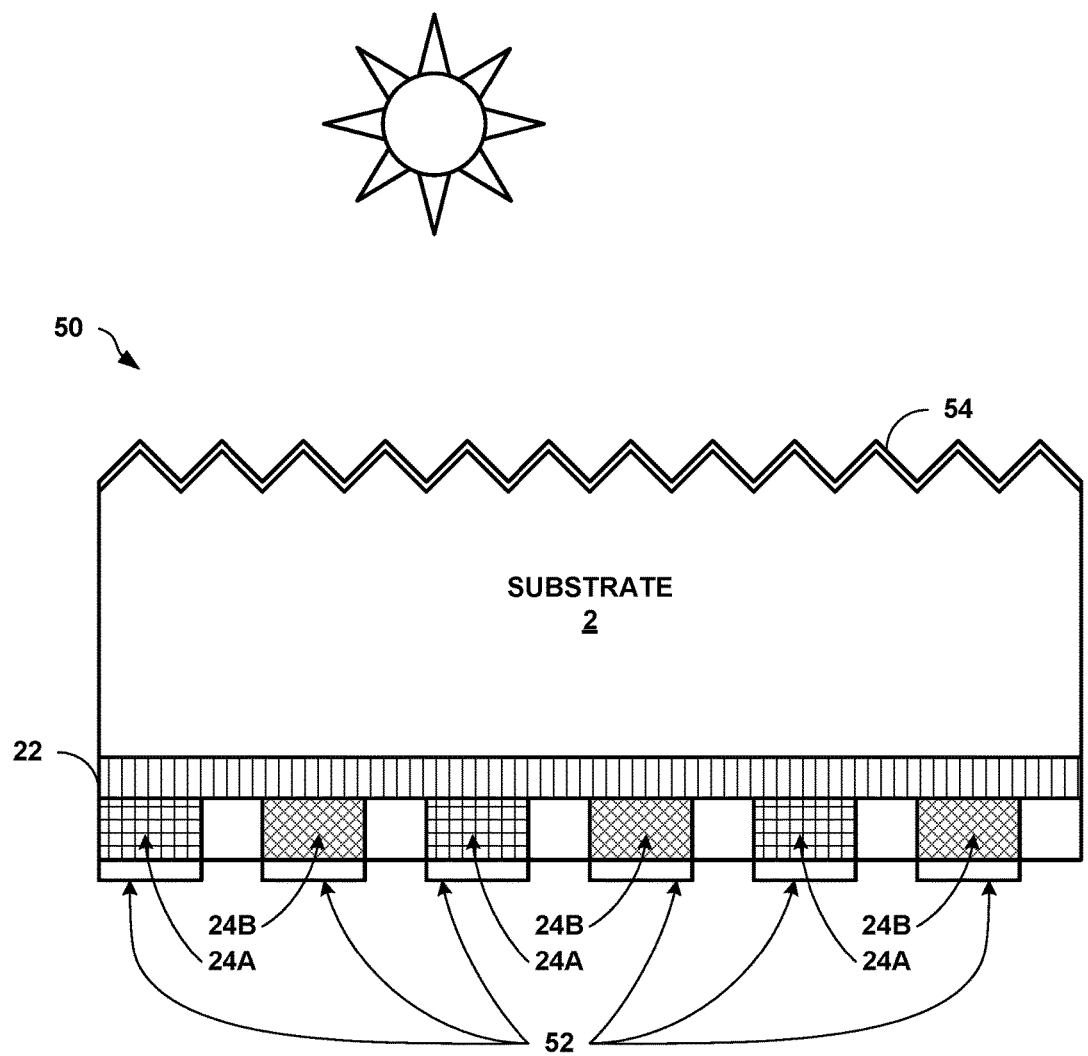
FIG. 3 is a conceptual diagram illustrating an example solar cell with passivated contacts formed using ion implantation, in accordance with one or more aspects of the present disclosure.

FIG. 3 is a conceptual diagram illustrating an example solar cell with passivated contacts formed using ion implantation, in accordance with one or more aspects of the present disclosure. For purposes of illustration, the example solar cell of FIG. 3 is described below with reference to FIGS. 1A-1D. The structures and components shown in FIG. 3 are not to scale.

FIG. 3 includes solar cell 50. Solar cell 50 represents one example of an interdigitated back contact solar cell. Solar cell 50 includes substrate 2, compound layer 22, doped layers 24A and 24B (collectively "doped layers 24"), metal contacts 52, and dielectric passivation and anti-reflection layers 54.

Solar cell 50, as shown in the example of FIG. 3, may be formed from substrate 2 using one or more of the techniques described herein. Substrate 2 may be a Si wafer. Compound-forming ions, such as O ions or others, may be implanted into substrate 2 through a back surface of substrate 2 to create a region containing compound-forming ions.

In the example of FIG. 3, two rounds of dopant ion implantation may be performed. A first type of dopant ions (e.g., P-type dopant ions) may be implanted into substrate 2 through portions of the back surface of substrate 2 to create regions containing the first type of dopant ions. A second type of dopant ions (e.g., N-type dopant ions) may be implanted into substrate 2 through other portions of the back surface of substrate 2 to create regions containing the second type of dopant ions.

Substrate 2 may be annealed to heal implant damage and create layers as described herein. For instance, annealing may transform the region containing compound-forming ions into compound layer 22. Annealing may also transform the regions containing the first type of dopant ions into doped layer 24A and the regions containing the second type of dopant ions into doped layer 24B.

Metal contacts 52 may be formed over each section of doped layers 24. The front surface of substrate 2 may be textured and coated with dielectric passivation and anti-reflection layers 54 to form solar cell 50 as shown in the example of FIG. 3. In this way, the passivated contacts of solar cell 50 may be formed using ion implantation. Consequently, fabrication complexity and/or cost may be reduced.

The foregoing disclosure includes various examples set forth merely as illustration. The disclosed examples are not intended to be limiting. Modifications of the disclosed examples incorporating the spirit and substance of the described methods and/or devices may occur to persons skilled in the art. These and other examples are within the scope of the following claims.

What is claimed is:
1. A method comprising, in order:
by ion-implantation, implanting a first element as a first ion into a first region of a substrate at a first depth below a surface of the substrate;
by ion-implantation, implanting a second element as a second ion into a second region of the substrate at a second depth below the surface, the second depth being between the surface and the first depth; and
annealing the substrate, wherein:
the substrate comprises a semiconductor,
the first ion is different from the second ion,
the annealing converts the second region to a second layer comprising the second element and the semiconductor,
the annealing converts the first region to a first layer comprising the first element and the semiconductor,
a first unconverted layer of the substrate remains after the annealing, such that the first layer is between the second layer and the first unconverted layer, and
the annealing forms at least one pinhole area through the first layer such that at least a portion of the second element is capable of diffusing through the at least one pinhole area from the second layer to the first unconverted layer.
2. The method of claim 1, wherein the first layer has a thickness between greater than zero Å and less than 100 Å.
3. The method of claim 1, wherein the second layer has a monocrystalline structure.
4. The method of claim 3, further comprising, before the implanting the first element, depositing an additional layer on the surface by an epitaxial method.
5. The method of claim 1, further comprising, after the annealing, depositing a metal on the second layer to form a low resistance contact.
6. The method of claim 5, wherein the metal comprises at least one of aluminum, nickel, or silver.
7. The method of claim 6, wherein the low resistance contact is interdigitated.
8. The method of claim 1, further comprising
an additional annealing of the substrate prior to the implanting the second element.
9. The method of claim 1, wherein:
the first depth is between about 20 nanometers and about 300 nanometers, and
the second depth is between about 10 nanometers and about 300 nanometers.
10. The method of claim 1, wherein the first element comprises oxygen.
11. The method of claim 10, wherein the first element further comprises at least one of hafnium or nitrogen.
12. The method of claim 1, wherein the second element comprises at least one of phosphorus, arsenic, antimony, boron, aluminum, indium, or gallium.
13. The method of claim 1, wherein the semiconductor comprises monocrystalline silicon.
14. The method of claim 13, wherein:
after the implanting of the first element and the implanting of the second element, the first layer and the second layer are substantially amorphous,
after the implanting of the first element and the implanting of the second element, a second unconverted substrate layer exists between the first layer and the second layer, and
the annealing converts at least a portion of at least one of the first layer or the second layer to a monocrystalline form.

15. The method of claim 13, wherein:

after the implanting of the first element and the implanting of the second element, the first layer and the second layer are substantially amorphous, after the implanting of the first element and the implanting of the second element, a third unconverted substrate layer exists between the second layer and the surface, and the annealing converts at least a portion of at least one of the first layer or the second layer to a monocrystalline form.

16. The method of claim 1, wherein the annealing is performed by heating the substrate to a temperature between 800° C. and 1200° C.

17. The method of claim 16, wherein the substrate is maintained at the temperature for a period of time between 30 minutes and 90 minutes.

18. The method of claim 1, wherein the first layer comprises silicon dioxide.

19. The method of claim 18, wherein the first layer further comprises at least one of silicon nitride or hafnium oxide.

20. A method comprising, in order:

by ion-implantation, implanting a first element as a first ion into a first region of a substrate at a first depth below a surface of the substrate;

by ion-implantation, implanting a second element as a second ion into a second region of the substrate at a second depth below the surface, the second region being between the surface and the first region; and annealing the substrate, wherein:

the substrate comprises a crystalline semiconductor, the first ion is different from the second ion, the annealing converts the first region to a first crystalline layer comprising the first element and the semiconductor, the first crystalline layer has a thickness between greater than zero Å and less than 100 Å, the annealing converts the second region to a second crystalline layer comprising the second element and the semiconductor, the first layer is capable of transporting carriers between the second layer and an unconverted layer of the substrate, and the first layer is between the second layer and the unconverted layer.

\* \* \* \* \*